United States Patent
Ham (10) Patent No.: US 8,797,621 B2
(45) Date of Patent: Aug. 5, 2014

(54) ATOM PHASE-CONTROLLED DOUBLE REPHASING-BASED QUANTUM MEMORY AND DOUBLE-REPHASED PHOTON ECHO METHOD THEREFOR

(75) Inventor: Byoung Seung Ham, Incheon (KR)

(73) Assignees: INHA Industry Partnership Institute, Incheon (KR); Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 13/466,471

(22) Filed: May 8, 2012

(65) Prior Publication Data

US 2013/0182303 A1     Jul. 18, 2013

(30) Foreign Application Priority Data

Jan. 12, 2012 (KR) .................. 10-2012-0003954

(51) Int. Cl.
*B82Y 10/00*     (2011.01)
*G06N 99/00*     (2010.01)

(52) U.S. Cl.
CPC ............. *B82Y 10/00* (2013.01); *G06N 99/002* (2013.01); *Y10S 977/933* (2013.01)
USPC ............................. 359/107; 977/933

(58) Field of Classification Search
CPC .............................. B82Y 10/00; G06N 99/002
USPC ................................... 359/107; 977/933
See application file for complete search history.

(56) References Cited

U.S. PATENT DOCUMENTS

2010/0012827 A1* 1/2010 Vestergaard Hau ........... 250/251
2010/0232792 A1* 9/2010 Ham ............................... 398/45

FOREIGN PATENT DOCUMENTS

KR     10-2010-0016999 A     2/2010

OTHER PUBLICATIONS

Byoung Ham, "Ultralong Efficient Photon Storage Using Optical Locking," Aug. 31, 2010, Cornell University Library, arXiv.org > quant-ph > arXiv:1009.0055, 1-5.*
Byoung Ham, "On-demand control of photon echoes far exceeding the spin coherence constraint via coherence swapping between optical and spin transitions," Oct. 23, 2010, Cornell University Library, arXiv.org > quant-ph > arXiv:1010.4870, 1-8.*
Nicolas Sangouard et al. "Impossibility of faithfully storing single photons with the three-pulse photon echo," Jun. 24, 2010, The American Physical Society, Physical Review A 81, 062333, 1-5.*
Byoung S. Ham "Atom phase controlled noise-free photon echoes," Jan. 28, 2011, Cornell University Library, arXiv:1101.5480 [quant-ph], pp. 1-5.*

* cited by examiner

*Primary Examiner* — Alicia M Harrington
*Assistant Examiner* — Marin Pichler
(74) *Attorney, Agent, or Firm* — Lowe Hauptman & Ham, LLP (57) ABSTRACT

Disclosed herein are atom phase-controlled double rephasing-based quantum memory and a double-rephased photon echo method therefor. The atom phase-controlled double rephasing-based quantum memory includes an optical medium and an optical pulse generation unit. The optical medium has three energy levels (|1>, |2> and |3>), receives one or more optical pulses from an optical pulse generation unit, and generates output light that satisfies phase matching conditions. The optical pulse generation unit generates at least five optical pulses that resonate among the energy levels of the optical medium.

10 Claims, 7 Drawing Sheets

ATOM PHASE-CONTROLLED DOUBLE REPHASING-BASED QUANTUM MEMORY AND DOUBLE-REPHASED PHOTON ECHO METHOD THEREFOR

BACKGROUND OF THE INVENTION

1. Field of the Invention

The present invention relates generally to atom phase-controlled double rephasing-based quantum memory and, more particularly, to a modified photon echo method using a nonlinear optical medium having three energy levels and at least five optical pulses oscillating among the energy levels of the optical medium.

2. Description of the Related Art

In an information processing device such as a computer, a memory is one of the key elements of logic circuits. Unlike conventional optical memory currently commercialized, a quantum memory should store a quantum state and reproduce the stored quantum state in an arbitrary time. Quantum memory is required to have fidelity higher than 67%.

Furthermore, in order to perform long-distance quantum communications, a quantum repeater capable of restoring the attenuation of quantum signals is required. The key component of this quantum repeater is quantum memory. The requirement of the quantum memory is a long storage time equal to or longer than one second. However, the longest storage time of quantum memory hitherto known is merely tens of milliseconds.

Meanwhile, a photon echo is a method using the different phases of atomic coherence generated via light interactions with a resonant medium having two energy levels. A photon echo uses reversible inhomogeneous broadening, where each phase of atomic coherence broadly distributed along the inhomogeneous broadening is swapped by an optical π-pulse that allows population swapping between the two energy levels.

In this case, inhomogeneously broadened atoms have a random spectral detuning against the resonating light. The phase evolution speed of each excited atom is proportional to the detuning determined by the spectral distribution. Thus, the sum of entire atomic phases quickly disappears, where the dephasing time is inversely proportional to spectral width of atomic distribution.

When a π-pulse is applied and the medium's population is swapped, the coherence evolution direction is reversed and initial phase is recovered at last. This recovered atomic coherence is referred to as a photon echo. The photon echo and the medium's population inversion have an inseparable relation.

However, a photon echo inevitably accompanies spontaneous emission process as well as stimulated emission under the population inversion by the π pulse.

Furthermore, in conventional optical information processing, a stimulated emission phenomenon acts as signal gain. In contrast, quantum information processing, spontaneous emission or stimulated emission acts as noise according to the no-cloning theorem. Thus, a photon echo scheme cannot be fundamentally applied to quantum memory.

Conventional quantum memory schemes were filed for patents and published in a plurality of documents including Korean Unexamined Patent Application Publication No. 10-2010-0016999호 (hereinafter referred to as "prior art document").

The quantum memory schemes disclosed in the prior art documents include quantum memory that includes first and second ground states that are proximate in terms of energy or are degenerate and prevent dipole transition, an excited state that allows two-photon transition between the first and second ground states, allows spin coherence and has spin inhomogeneous characteristics, and a proximate ground state that prevents dipole transition in connection with the first and second ground states and allows only transition in connection with the excited state, performs two-photon transition from the first and second ground states to the excited state and induces spin coherence, and then transitions to the proximate ground state and freezes the phase of the spin coherence, thereby storing data.

The conventional technology disclosed in the above-described prior art document is configured to store optical data in spins using Raman coherence based on spin inhomogeneous broadening, unlike photon echo-based quantum memory using optical transition inhomogeneous broadening. Although the conventional technology can lengthen the storage time up to several hours determined by the spin population decay time, it has not solved the population inversion problem offering quantum noises.

SUMMARY OF THE INVENTION

Accordingly, the present invention has been made keeping in mind the above problems occurring in the prior art, and an object of the present invention is to enable a photon echo method to be directly applied to a quantum memory. Unlike conventional photon echoes, noise incurred by the π pulse-induced population inversion is eliminated by double rephasing using rephasing pulse 1 and rephasing pulse 2. The storage time in the present inversion is extended by using optical locking method via optical-spin coherence replacement phenomenon.

In order to accomplish the above object, the present invention provides atom phase-controlled double rephasing-based quantum memory, including an optical medium configured to have three energy levels ($|1>$, $|2>$ and $|3>$), and configured to receive one or more optical pulses from an optical pulse generation unit and generates output light that satisfies phase matching conditions; and an optical pulse generation unit configured to generate at least five optical pulses that resonate among the energy levels of the optical medium.

The three energy levels may include ground states ($|1>$ and $|2>$) and an excited state ($|3>$).

The at least five optical pulse may include a first optical pulse group comprising one or more of an input light and rephasing pulse 1 resonating between the energy levels ($|1>$ and $|3>$) of the optical medium; a second optical pulse group comprising a first phase control pulse resonating between the energy levels ($|2>$ and $|3>$) of the optical medium; and a third optical pulse group comprising rephasing pulse 2 resonating between the energy levels ($|1>$ and $|3>$) of the optical medium and a second phase control pulse resonating between the energy levels ($|2>$ and $|3>$) of the optical medium.

The output light may be converted into final output light by rephasing pulse 2.

The final output light as an echo is generated by double rephasing using the rephasing pulse 1 and the rephasing pulse 2.

The final output light must satisfy phase matching conditions that are given by operations among the input light (D), the rephasing pulse 1 (R1), the rephasing pulse 2 (R2), the first phase control pulse (B1) and the second phase control pulse (B2).

The phase matching conditions are given by the following relations:

$$k_{E2}=2k_{R2}-k_{E1}=2k_{R2}-k_D+k_{B1}-k_{B2}, \quad (1)$$

$$f_{E2}=2f_{R2}-f_{E1}=2f_{R2}-f_D+f_{B1}-f_{B2}, \quad (2)$$

where $k_i$ is the wave propagation vector of the optical pulse i and $f_i$ is the frequency of the optical pulse i.

The second optical pulse group may include the first phase control pulse configured to make atoms in the energy level (|3>), excited by the rephasing pulse 1 of the first optical pulse group, transfer to the energy level (|2>) and the second phase control pulse configured to make the atoms in the energy level (|2>) transfer back to the energy level (|3>).

The input light may composed of a single pulse or a plurality of pulses.

In order to accomplish the above object, the present invention provides a doubly rephased photon echo for atom phase-controlled double rephasing-based quantum memory, including (a) causing input light to enter an optical medium and generate a phase grating (optical coherence); (b) causing rephasing pulse 1 to enter the optical medium and reverse phase evolution of the phase grating; (c) causing a first phase control pulse to enter the optical medium and replace the phase grating with a spin phase grating (spin coherence); (d) causing a second phase control pulse to enter the optical medium and restore the spin coherence to the optical coherence; (e) generating output light as a silence echo; and (f) generating final output light as an echo using rephasing pulse 2.

The present invention provides the advantage of enabling a photon echo method to be directly applied to quantum memory because noise is eliminated by double rephasing using rephasing pulse 1 and rephasing pulse 2, and the advantage of extending the storage time of a photon echo using an optical-spin coherence replacement phenomenon.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Reference now should be made to the drawings, in which the same reference numerals are used throughout the different drawings to designate the same or similar components.

Terms and words used in the present specification and the accompanying claims should be interpreted as having meanings and denoting concepts which are in conformity with the technical spirit of the present invention on the basis of the principle in which an inventor can appropriately define the concepts of terms so as to best describe his or her invention. It should be noted that detailed descriptions of well-known functions related to the present invention and the configurations thereof will be omitted in the following description if it is determined that they would make the gist of the present invention obscure.

An atom phase-controlled double rephasing-based quantum memory according to the present invention will be described in detail below with reference to the accompanying drawings.

Figure 1A:
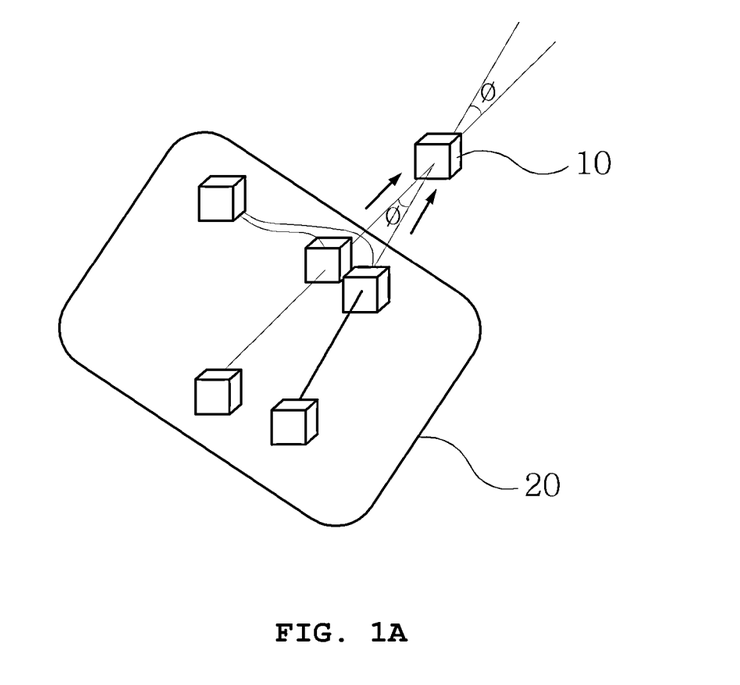
FIG. 1A is a diagram showing the configuration of atom phase-controlled double rephasing-based quantum memory according to the present invention.
Figure 1B:
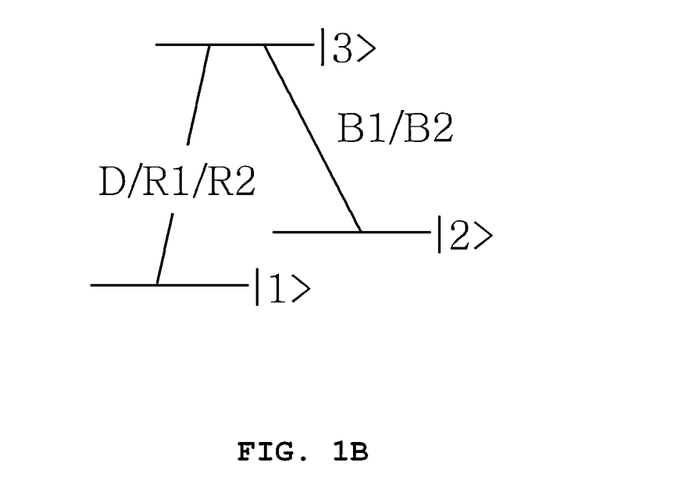
FIG. 1B is a diagram illustrating the energy levels of an optical medium that interacts with the optical pulses of the atom phase-controlled double rephasing-based quantum memory according to the present invention.
Figure 1C:
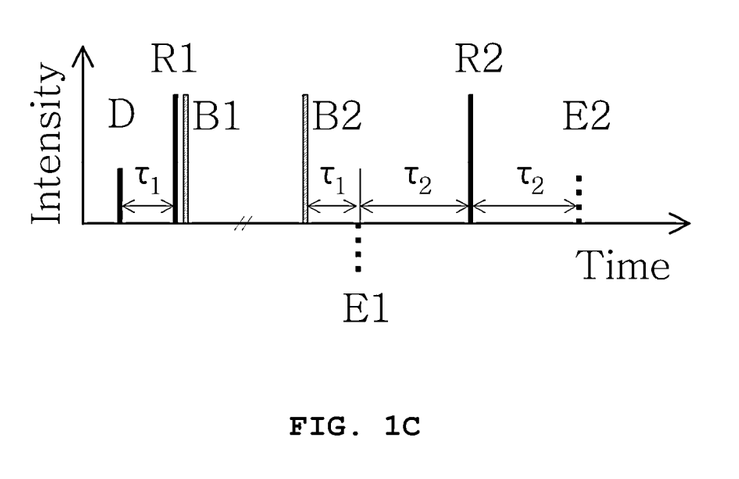
FIG. 1C is a graph illustrating the sequence of application of the optical pulses of the atom phase-controlled double rephasing-based quantum memory according to the present invention.
Figure 1D:
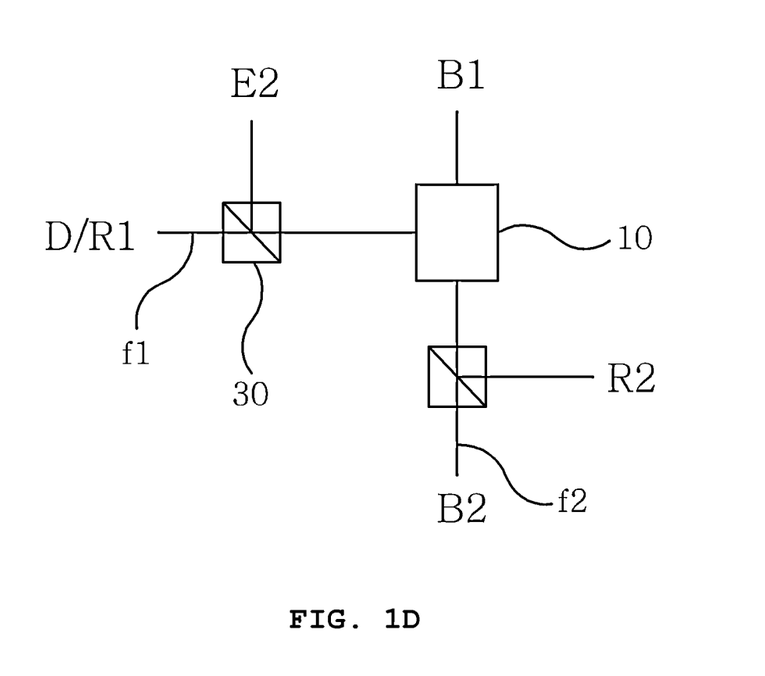
FIG. 1D is a diagram illustrating an embodiment of the atom phase-controlled double rephasing-based quantum memory according to of the present invention.

FIG. 1A is a diagram showing the configuration of atom phase-controlled double rephasing-based quantum memory according to the present invention, FIG. 1B is a diagram illustrating the energy levels of a medium that interacts with optical pulses, FIG. 1C is a diagram illustrating the sequence of application of optical pulses, and FIG. 1D is a diagram illustrating the detailed configuration of the atom phase-controlled double rephasing-based quantum memory.

As shown in FIG. 1A, the atom phase-controlled double rephasing-based quantum memory according to an embodiment of the present invention includes an optical medium 10, and an optical pulse generation unit 20 for generating at least five optical pulses that oscillate among the energy levels of the optical medium 10.

Furthermore, as shown in FIG. 1B, the optical medium 10 has nonlinear optical characteristics and three energy levels, that is, |1>, |2> and |3>.

Here, among these three energy levels, |1> and |2> are ground states and |3> is an excited state. The energy level of |3> is the highest of the three energy levels, and the energy level of |1> is higher than the energy level of |2>.

Furthermore, as shown in FIG. 1C, the at least five optical pulses generated by the optical pulse generation unit 20 may be classified into a first optical pulse group f1 including one or more of an input light D and rephasing pulse 1 R1 resonating between the energy levels |1> and |3> of the optical medium 10, a second optical pulse group f2 including a first phase control pulse B1 resonating between the energy levels |2> and |3> of the optical medium 10, and a third optical pulse group f3 including rephasing pulse 2 R2 resonating between the energy levels |1> and |3> of the optical medium 10 and a second phase control pulse B2 resonating between the energy levels |2> and |3> of the optical medium 10.

Here, the at least five optical pulses are incident on the optical medium 10 via an optical fiber, surface plasmons or free space.

Furthermore, the first optical pulse group f1 is used for a typical photon echo scheme, the second optical pulse group f2 includes the first phase control pulse B1 making excited atoms transition to energy level |2> using the rephasing pulse 1 R1 of the first optical pulse group f1 and the second phase control pulse B2 making excited atoms transition from energy level |2> to energy level |3> using the rephasing pulse 1 R1 of the first optical pulse group f1, and the first and second optical pulse groups f1 and f2 use light beams having different wavelengths or polarizations.

Furthermore, the input light D includes a single pulse or a plurality of pulses, and the duration of the rephasing pulse 1 R1 is shorter than optical phase decay time to minimize coherence loss.

Furthermore, the duration of the first phase control pulse B1 and the second phase control pulse B2 should be shorter than spin phase decay time.

Furthermore, the output light E1 is generated by interactions among the nonlinear optical medium 10 having three energy levels |1>, |2> and |3> and the at least five optical pulses incident on the optical medium 10.

In this case, the output light E1 has a total of $2\pi$ phase shift because the phase gain of atom coherence becomes $\pi$ via the first and second phase control pulses B1 and B2 having the same $\pi$-pulse and the rephasing pulse 1 R1 provides the phase gain $\pi$. Therefore, the atom coherence of the output light E1 has the same absorption characteristics as those of the input light D.

Meanwhile, the output light E1 that does not have the same absorption characteristics as the input light D cannot absorb and emit any atom in response to the population inversion of the energy levels |1> and |3>, and forms a situation that has no influence on the atom coherence, that is, a silence echo.

Furthermore, final output light E2 is generated by eliminating noise from the output light E1 generated by interactions among the nonlinear optical medium 10 having three energy levels |1>, |2> and |3> and the at least five optical pulses incident on the optical medium 10.

The final output light E2 is generated in another photon echo process via the following rephasing pulse 2 R2 after the output light E1 has been generated. The final output light E2 has the phase difference $3\pi$ of the final atom coherence, that is, emission characteristics, via the double phase inversion based on the rephasing pulse 1 R1 and the rephasing pulse 2 R2.

Here, the final output light E2 satisfies phase matching conditions including the input light D, the rephasing pulse 1 R1, the rephasing pulse 2 R2, the first phase control pulse B1 and the second phase control pulse B2. The phase matching conditions satisfy the following relations 1 and 2:

$$k_{E2}=2k_{R2}-k_{E1}=2k_{R2}-k_D+k_{B1}-k_{B2} \quad (1)$$

$$f_{E2}=2f_{R2}-f_{E1}=2f_{R2}-f_D+f_{B1}-f_{B2} \quad (2)$$

In the above relations, $k_i$ is the propagation wave vector of an optical pulse i, and $f_i$ is the frequency of the optical pulse i.

That is, in Relation 1, if kB2=kR2=−kB1, kE2=−kD, so that the final output light E2 becomes the phase conjugate signal of the input light D.

In this case, the phase conjugate is light that has the phase and the opposite propagation direction. Here, the phase conjugate has been used for image processing without distortion, and is an important method that fundamentally prevents the echo re-absorption of in conventional photon echo method and achieves the maximum echo efficiency.

An embodiment of the present invention will be briefly described with reference to FIG. 1D. The first optical pulse group f1 including the input light D and the rephasing pulse 1 R1, and the second optical pulse group f2 including the first phase control pulse B1, the second phase control pulse B2 and the rephasing pulse 2 R2 are sequentially incident on the nonlinear optical medium 10. Furthermore, the final output light E2 that satisfies the phase matching conditions becomes the phase conjugate of the input light D and is generated in the direction opposite to the propagation direction of the input light D. The final output light E2 is split by a beam splitter 30.

Figure 2:
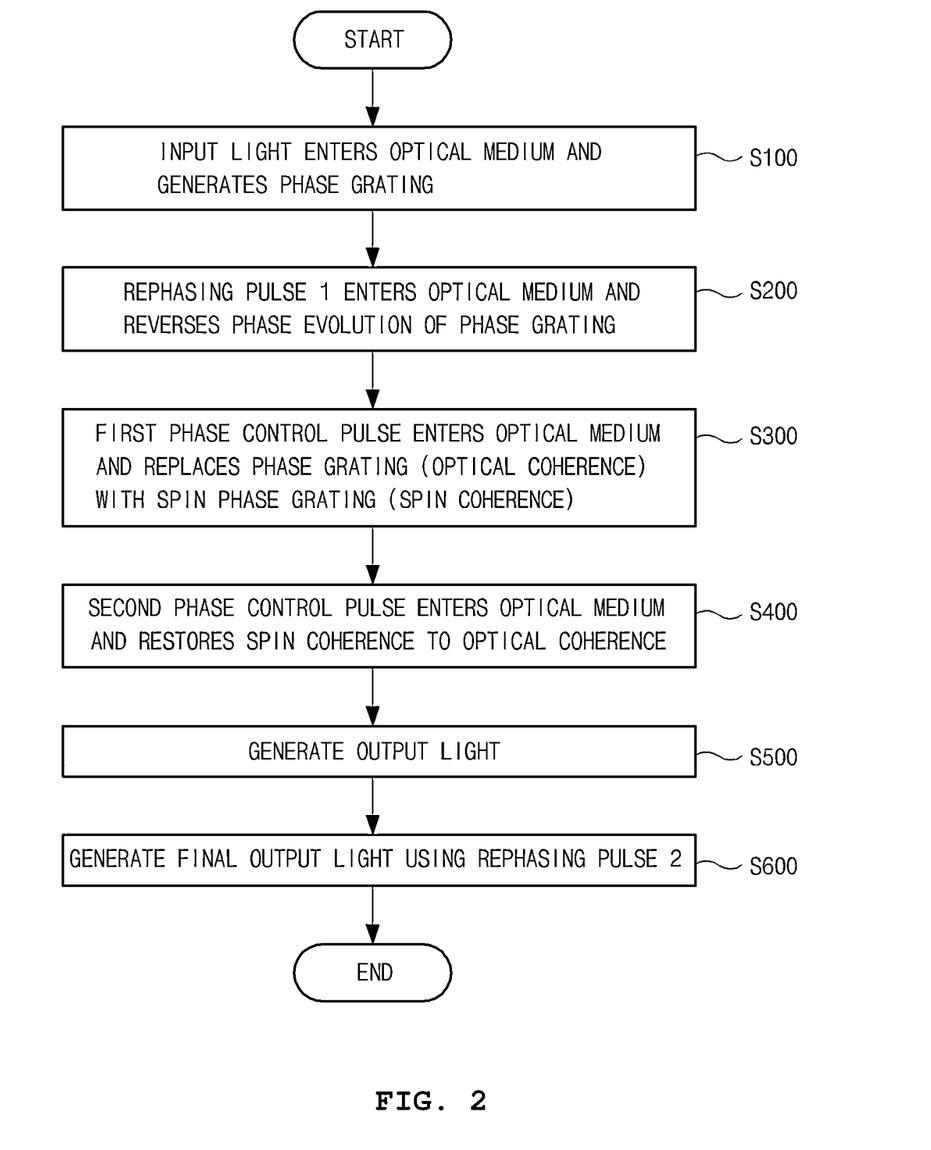
FIG. 2 is a flowchart illustrating the double-rephased photon echo method of the atom phase-controlled double rephasing-based quantum memory according to the present invention.

Meanwhile, the doubly rephased photon echo method of the above-described atom phase-controlled double rephasing-based quantum memory according to the embodiment of the present invention is illustrated in FIG. 2.

First, the input light D is incident on the optical medium 10 and produces a phase grating at step S100.

Thereafter, the rephasing pulse 1 R1 is incident on the optical medium 10 and reverses the phase evolution of the phase grating at step S200.

Thereafter, the first phase control pulse B1 is incident on the optical medium 10 and replaces the phase grating (optical coherence) with a spin phase grating (spin coherence) at step S300.

Thereafter, the second phase control pulse B2 is incident on the optical medium 10 and restores the spin coherence to optical coherence at step S400.

Thereafter, the output light E1 is generated as a silence echo at step S500.

Furthermore, the final output light E2 is generated by the rephasing pulse 2 R2 at step S600.

At step S100, the phase grating stores information in such a way that the information of the input light D is replaced with the amplitude and phase coherence.

FIGS. 3(a) to 3(d) are diagrams showing simulations of the atom phase-controlled double rephasing-based quantum memory according to the present invention. These drawings show the results of simulations of the quantum memory shown in FIG. 1.

Figure 3A:
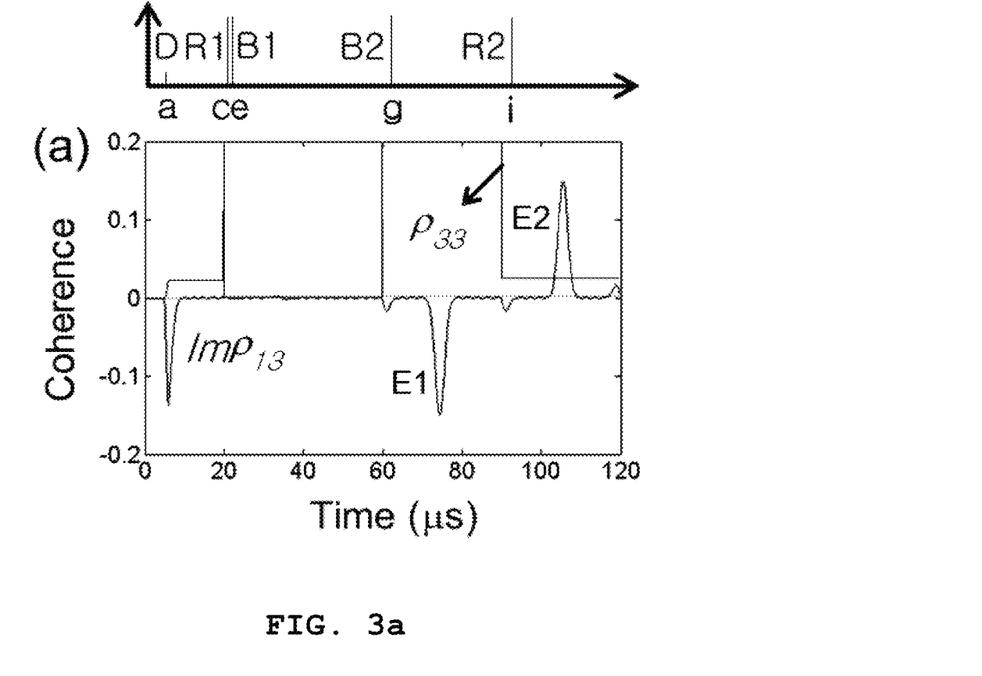
FIGS. 3(a) to 3(d) are diagrams illustrating an example of a simulation of the atom phase-controlled double rephasing-based quantum memory according to the present invention.
Figure 3B:
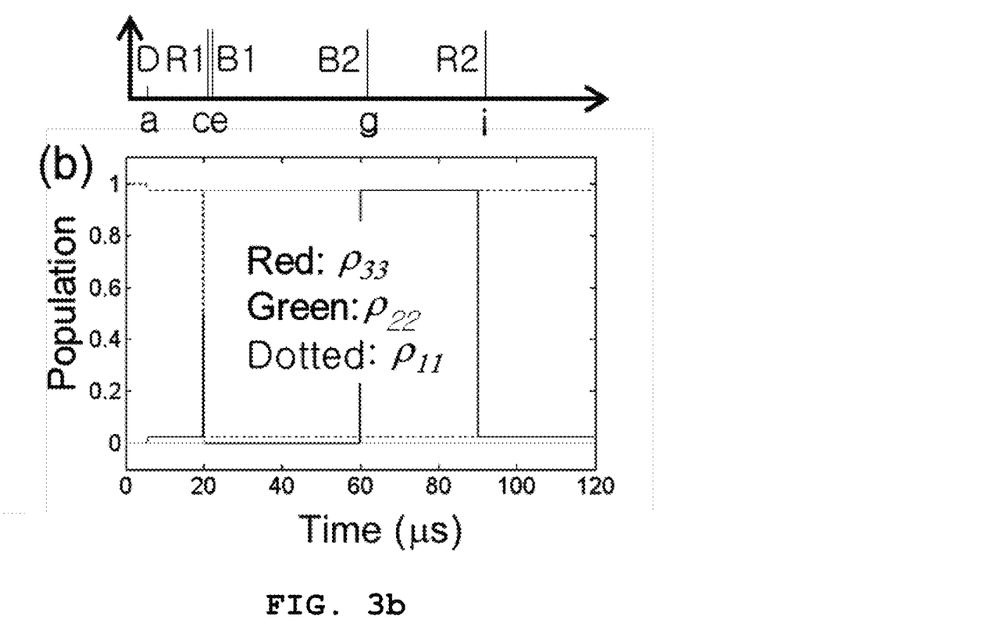

FIG. 3(a) shows the absorption characteristics of the output light E1 and the emission characteristics of the final output light E2. Furthermore, FIG. 3(b) shows a state in which quantum noise attributable to spontaneous emission or stimulated emission has been eliminated because the final output light E2 satisfies a state without population inversion.

Figure 3C:
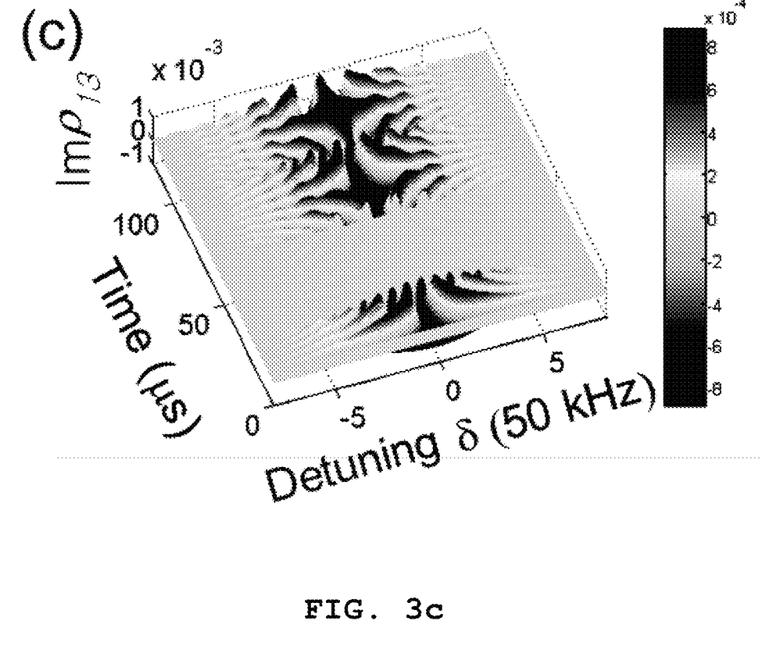

Furthermore, FIGS. 3(c) and (d) show an extended simulation of FIG. 2(a) for all atom groups. That is, the sum of the spectra of FIG. 3(c) becomes FIG. 3(a), which exhibits the phase evolution of detuned atoms over time with respect to resonating laser light. FIGS. 3(c) and (d) show the different evolution speeds of individual atoms. These different evolution speeds are inverted by the rephasing pulse 1 R1. The phase recovery phenomenon of all the atoms attributable to the above speed inversion is referred to as a photon echo.

Figure 3D:
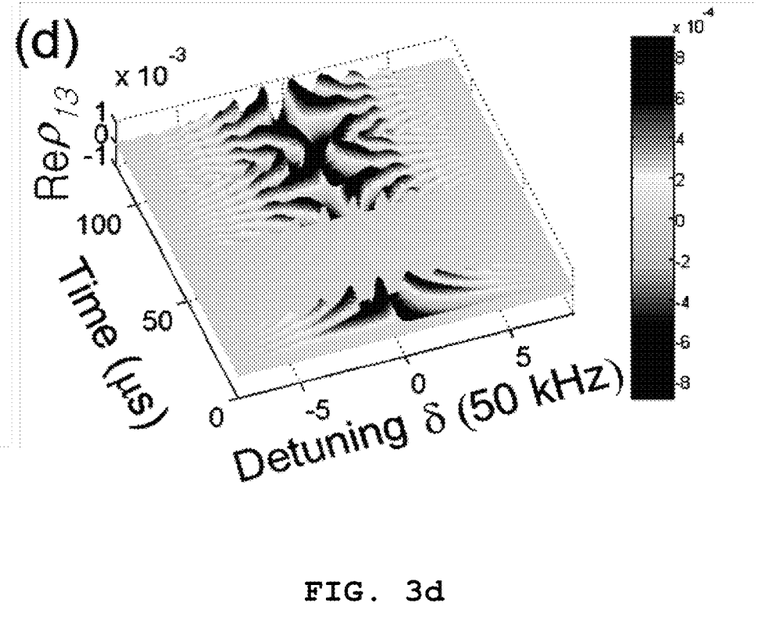

That is, the final output light E2 is the rephased photon echo of the output light E1.

Figure 4A:
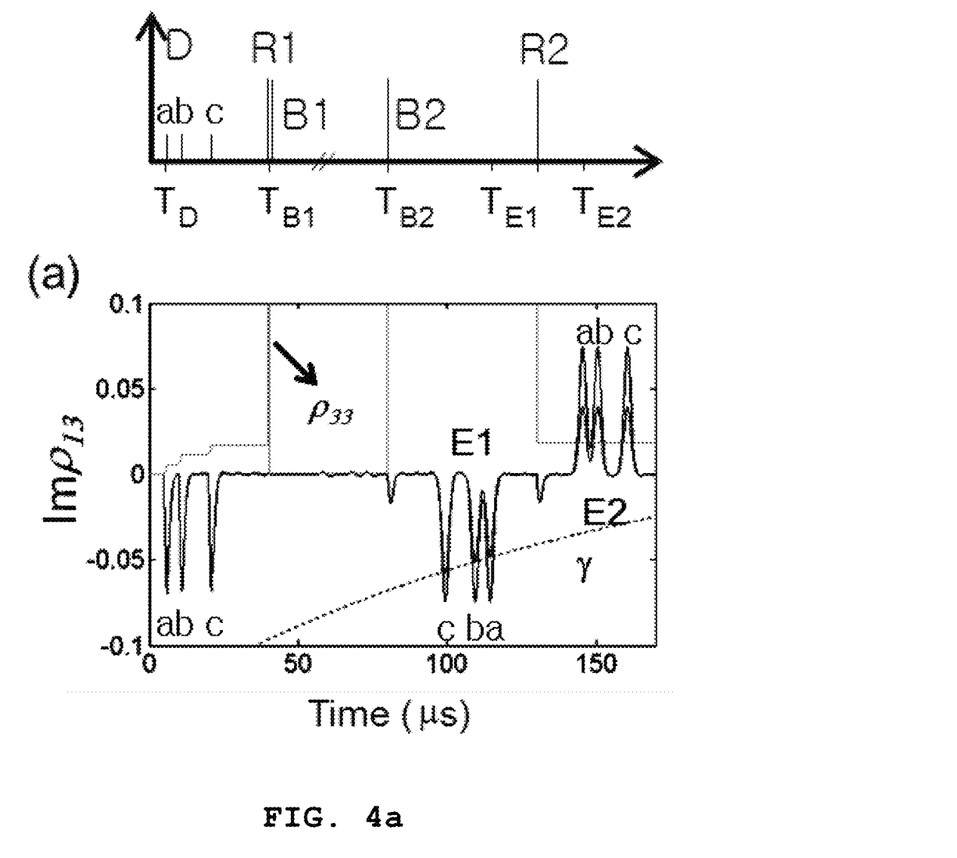
FIGS. 4(a) and 4(b) are diagrams illustrating an example of a simulation of the multiple data pulses of the atom phase-controlled double rephasing-based quantum memory according to the present invention.

FIG. 4(a) is a diagram illustrating a simulation of a case where the input light D includes three light beams in FIG. 3. The red line indicates a simulation of a case where the phase/population decay time of a medium has a finite value. If the phase/population decay time is 0 (indicated by the blue line), there is no decay over the time of the atom coherence, so that the intensity of the output light E1 is always the same as the intensity of the input light D.

However, if the phase/population decay time is finite, the intensity of the output light E1 exponentially decreases over time.

Figure 4B:
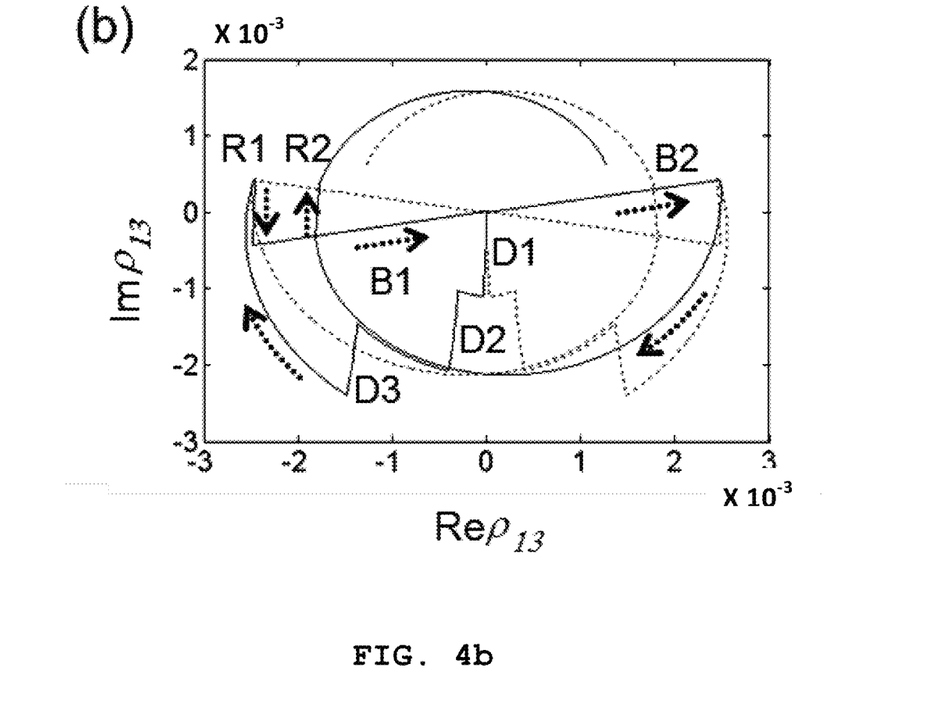

Furthermore, FIG. 4(b) is a diagram illustrating a Bloch vector representation of FIG. 4(a). The atom group that is made inhomogeneous in the opposite directions around the resonance frequency has the opposite phase evolution directions, and illustrates a typical photon echo method that recovers the initial phase at the same time due to the time reverse effect attributable to the rephrased light.

In addition, a case where the optical coherence is made to be 0 by the first phase control pulse B1 indicates a process in which the optical coherence is replaced with spin coherence, and also indicates that the phase difference is accompanied when the spin coherence is replaced with the optical coherence again by the second phase control pulse B2.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. Atom phase-controlled double rephasing-based quantum memory, the memory comprising:
an optical medium having three energy levels including first energy level (|1>), second energy level (|2>), and third energy level (|3>), and configured to
receive one or more optical pulses from an optical pulse generation unit, and
generate output light that satisfies phase matching conditions; and
the optical pulse generation unit configured to generate at least five optical pulses that resonate among the energy levels of the optical medium,
wherein the optical medium is further configured to
generate the output light having $\pi$ phase shift by using first and second phase control pulses having $\pi$-pulse,
shift the $\pi$ phase shift of the output light into $2\pi$ phase shift by using a rephasing pulse 1 providing phase gain $\pi$, and
generate final output light having emission characteristic by shifting the $2\pi$ phase shift of the output light to $3\pi$ phase shift by using a rephasing pulse 2 providing phase gain $\pi$.

2. The atom phase-controlled double rephasing-based quantum memory as set forth in claim 1, wherein the first and second energy levels (|1> and |2>) comprise ground states, and the third energy level comprises an excited state (|3>).

3. The atom phase-controlled double rephasing-based quantum memory as set forth in claim 1, wherein the optical pulse generation unit is further configured to generate the at least five optical pulses comprising:
a first optical pulse group comprising one or more of input light and the rephasing pulse 1 resonating between the first and third energy levels (|1> and |3>) of the optical medium;
a second optical pulse group comprising the first phase control pulse resonating between the second and third energy levels (|2> and |3>) of the optical medium; and
a third optical pulse group comprising the rephasing pulse 2 resonating between the first and third energy levels (|1> and |3>) of the optical medium and the second phase control pulse resonating between the second and third energy levels (|2> and |3>) of the optical medium.

4. The atom phase-controlled double rephasing-based quantum memory as set forth in claim 1, wherein the optical medium is further configured to convert the output light into the final output light by using the rephasing pulse 2.

5. The atom phase-controlled double rephasing-based quantum memory as set forth in claim 4, wherein the optical medium is further configured to generate the final output light by double rephasing using the rephasing pulse 1 and the rephasing pulse 2.

6. The atom phase-controlled double rephasing-based quantum memory as set forth in claim 4, wherein the optical medium is further configured to generate the final output light which satisfies the phase matching conditions that are given by operations among the input light, the rephasing pulse 1, the rephasing pulse 2, the first phase control pulse and the second phase control pulse.

7. The atom phase-controlled double rephasing-based quantum memory as set forth in claim 6, wherein the optical medium is further configured to generate the final output light which satisfies the phase matching conditions given by the following Equations:

$$k_{E2}=2k_{R2}-k_{E1}=2k_{R2}-k_D+k_{B1}-k_{B2} \quad (1)$$

$$f_{E2}=2f_{R2}-f_{E1}=2f_{R2}-f_D+f_{B1}-f_{B2} \quad (2)$$

where
$k_{E1}$ is a propagation wave vector of the output light,
$k_{E2}$ is a propagation wave vector of the final output light,
$k_{R2}$ is a propagation wave vector of the rephasing pulse 2,
$k_D$ is a propagation wave vector of the input light,
$k_{B1}$ is a propagation wave vector of the first phase control pulse,
$k_{B2}$ is a propagation wave vector of the second phase control pulse,
$f_{E1}$ is a frequency of the output light,
$f_{E2}$ is a frequency of the final output light,
$f_{R2}$ is a frequency of the rephasing pulse 2,
$f_D$ is a frequency of the input light,
$f_{B1}$ is a frequency of the first phase control pulse, and
$f_{B2}$ is a frequency of the second phase control pulse.

8. The atom phase-controlled double rephasing-based quantum memory as set forth in claim 3, wherein the second optical pulse group comprises:
the first phase control pulse configured to make atoms, excited by the rephasing pulse 1 of the first optical pulse group, transition to the second energy level (|2>), and
the second phase control pulse configured to make the atoms transition from the second energy level (|2>) to the third energy level (|3>).

9. The atom phase-controlled double rephasing-based quantum memory as set forth in claim 3, wherein the input light comprises a single pulse or a plurality of pulses.

10. A double rephased photon echo method for atom phase-controlled double rephasing-based quantum memory, the method comprising:
causing input light to enter an optical medium and generate a phase grating in accordance with optical coherence;
causing rephasing pulse 1 to enter the optical medium and reverse phase evolution of the phase grating;
causing a first phase control pulse to enter the optical medium and replace the phase grating with a spin phase grating in accordance of spin coherence;
causing a second phase control pulse to enter the optical medium and restore the spin coherence to the optical coherence;
generating output light as a silence echo; and
generating final output light as an inversion-free echo using rephasing pulse 2,
wherein the output light have $2\pi$ phase shift and absorption characteristic according to the first and second phase control pulses having $\pi$-pulse and the rephasing pulse 1 providing phase gain $\pi$, and
wherein the final output light have emission characteristic according to the rephasing pulse 2 providing phase gain $\pi$.

* * * * *